(12) United States Patent
Zi et al.

(10) Patent No.: US 9,036,106 B2
(45) Date of Patent: May 19, 2015

(54) LIQUID CRYSTAL DISPLAY DEVICE IN WHICH ARRAY SUBSTRATE INCLUDES BLACK MATRIX AND METHOD OF MANUFACTURING THE SAME

(75) Inventors: Yubao Zi, Beijing (CN); JaeYun Jung, Beijing (CN); Shikai Wang, Beijing (CN); Daiwu Wu, Beijing (CN); Zhi Hou, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 445 days.

(21) Appl. No.: 13/403,297

(22) Filed: Feb. 23, 2012

(65) Prior Publication Data
US 2012/0249936 A1    Oct. 4, 2012

(51) Int. Cl.
| | |
|---|---|
| *G02F 1/136* | (2006.01) |
| *G02F 1/1335* | (2006.01) |
| *G02F 1/1333* | (2006.01) |
| *H01L 27/12* | (2006.01) |
| *H01L 29/786* | (2006.01) |
| *G02F 1/1362* | (2006.01) |

(52) U.S. Cl.
CPC ...... *H01L 27/1288* (2013.01); *H01L 29/78633* (2013.01); *G02F 1/136209* (2013.01)

(58) Field of Classification Search
USPC ..................................... 349/106, 44–47, 110
See application file for complete search history.

(56) References Cited

U.S. PATENT DOCUMENTS

| 6,174,754 B1 | 1/2001 | Lee et al. |
|---|---|---|
| 2001/0019130 A1 | 9/2001 | Yamazaki et al. |
| 2002/0024622 A1 | 2/2002 | Murade |
| 2004/0125261 A1* | 7/2004 | Lee et al. ........................ 349/43 |
| 2007/0064179 A1 | 3/2007 | Park et al. |

FOREIGN PATENT DOCUMENTS

| CN | 1936650 A | 3/2007 |
|---|---|---|
| CN | 101089709 A | 12/2007 |
| CN | 101728436 A | 6/2010 |
| JP | 58159520 A | 9/1983 |

OTHER PUBLICATIONS

Second Chinese Office Action Issued Aug. 8, 2014; Appln. No. 201110076578.1.
First Chinese Office Action dated Jan. 27, 2014; Appln. No. 201110076578.1.

* cited by examiner

*Primary Examiner* — Huyen Ngo
(74) *Attorney, Agent, or Firm* — Ladas & Parry LLP

(57) ABSTRACT

The embodiment of the invention discloses a liquid crystal display and a method of manufacturing the same. The liquid crystal display of the embodiment of the invention comprises an array substrate, a color filter substrate and a liquid crystal layer formed between the array substrate and the color filter substrate. The array substrate comprises a first substrate; a black matrix formed on the first substrate; and a thin film transistor (TFT) device formed on the black matrix. The TFT device is a top gate TFT device having a gate electrode formed on a side of the TFT device facing away the black matrix and an active layer made of a-Si. The color filter substrate comprises a second substrate; and a color filter layer formed on the second substrate. The color filter substrate does not include a black matrix.

14 Claims, 3 Drawing Sheets

LIQUID CRYSTAL DISPLAY DEVICE IN WHICH ARRAY SUBSTRATE INCLUDES BLACK MATRIX AND METHOD OF MANUFACTURING THE SAME

BACKGROUND

The present invention relates to a liquid crystal display and a method of manufacturing the same.

Thin Film Transistor (TFT)-Liquid Crystal Display (LCD) comprises an array substrate (TFT substrate), a color filter substrate (CF substrate) and a liquid crystal layer filled between them. The array substrate comprises a first substrate and the color filter substrate comprises a second substrate. The first and second substrate is typically made of glass.

FIG. 1 shows a schematic structure of a conventional TFT-LCD. The TFT substrate comprises a bottom gate TFT device 13 in which a gate electrode is formed on a bottom side. The bottom gate TFT device 13 comprises a gate electrode 6 on a first substrate 11, a gate insulating layer 5a on the gate electrode 6, an active layer 2 of a-Si (amorphous silicon) on the gate insulating layer 5a, and a source electrode (S) 41/drain electrode 42 (D) on the active layer 2. In order to reduce contact resistance between the S/D layer and the active layer 2, an ohmic contact layer 3 of $N^+$a-Si with good conductivity may be formed between the S/D layer and the active layer so as to form a good ohmic contact with the S/D layer. The TFT substrate further comprises a passivation protective film 10 and a pixel electrode 7 on the passivation protective layer 10. The pixel electrode 7 is connected to the S/D layer through via hole 15 formed in the passivation protective layer 19 and is typically formed of transparent conductive materials such as indium tin oxide (ITO).

The color filter substrate comprises a black matrix 1, a color filter layer 9, and a counter electrode 8 in this order on a second substrate 12. The counter electrode 8 is typically formed of transparent conductive materials such as indium tin oxide (ITO). The manufacturing process of the color filter substrate is relatively simple.

A 5mask process is usually used for manufacturing the TFT substrate. The 5mask process comprises: forming a gate electrode pattern with a gate mask; etching an active layer of a-Si layer and a N+ a-Si layer with an active mask to form an active pattern; forming a SD electrode with SD mask; forming via holes by etching with a passivation protective mask; and forming a ITO pixel electrode layer with an ITO mask. Corresponding exposure processes used in the 5mask process are all conventional exposure method.

In the conventional thin film transistor (TFT)—liquid crystal display (LCD) described above, there are three issues to be concerned. Firstly, a-Si of the active layer in TFT device is a photosensitive material and the conducting channel is located in the uppermost layer of the bottom gate TFT device. Therefore, external lights can easily strike on the a-Si serving as the conducting channel during operation of TFT-LCD, resulting in deterioration of off-state property of the TFT device and having an adverse effect on standing property of the TFT-LCD, even causing image flickering and grey level variation in severe conditions. Secondly, since the TFT-LCD generally operates in a normal white mode for TN-type liquid crystal, image contrast would be decreased substantially due to light leakages occurred in non-display regions when displaying a black image. Thirdly, the liquid crystal subjected to a horizontal electric field between signal lines and pixel electrode would suffer a reverse-tilt alignment defect at edges of the pixel, which would decrease the image contrast and sometimes inducing afterimage. Thus it is necessary for the black matrix (BM) on the color filter substrate to overlap (shown as d1, d2 in FIG. 1) substantially an area where the pixel electrode 7 is formed on the TFT substrate, so as to ensure no light leakage. However, such overlap reduces aperture ratio of the TFT-LCD, which is disadvantageous for enhancing display quality of the device.

SUMMARY

The embodiment of the invention provides a liquid crystal display and a method of manufacturing the same.

The liquid crystal display of the embodiment of the invention comprises an array substrate, a color filter substrate and a liquid crystal layer formed between the array substrate and the color filter substrate. The array substrate comprises a first substrate; a black matrix formed on the first substrate; and a thin film transistor (TFT) device formed on the black matrix. The TFT device is a top gate TFT device having a gate electrode formed on a side of the TFT device facing away the black matrix. The color filter substrate comprises a second substrate; and a color filter layer formed on the second substrate.

According to embodiments of the invention, the TFT device comprises: an active layer formed on the black matrix; a source electrode and a drain electrode formed on a part of the active layer; an insulating layer formed above the active layer and covering the source electrode and the drain electrode; the gate electrode formed on the insulating layer between the source electrode and the drain electrode. An area occupied by the TFT device on the first substrate is contained within an area occupied by the black matrix on the first substrate. The TFT device and the black matrix occupy the same area on the first substrate. The array substrate further comprises a pixel electrode formed on the insulating layer and connected with the source electrode through via holes in the insulating layer. The pixel electrode is formed of indium tin oxide (ITO). The color filter substrate further comprises a counter electrode formed on the color filter layer. The counter electrode is formed from indium tin oxide (ITO). The TFT device further comprises an ohmic contact layer formed between the source electrode and the active layer and/or between the drain electrode and the active layer. The first substrate and the second substrate are formed of glass.

A method of manufacturing a liquid crystal display in the embodiment of the invention comprises steps of preparing an array substrate, preparing a color filter substrate and assembling the array substrate and the color filter substrate and injecting liquid crystal between the array substrate and the color filter substrate. The step of preparing the array substrate comprises steps of: providing a first substrate; forming a black matrix on the first substrate and forming a thin film transistor (TFT) device on the black matrix. The TFT device is a top gate TFT device having a gate electrode formed on a side of the TFT device facing away the black matrix. The step of preparing the color filter substrate comprises steps of: providing a second substrate; and forming a color filter layer on the second substrate.

According to the embodiment of the invention, the step of forming the black matrix and the TFT device on the first substrate comprises: forming a stack layer including a black matrix layer, an active layer and an electrode layer in this order on the first substrate; forming a photoresist layer on the stack layer; patterning the photoresist layer using a half tone mask by a lithography and etching, so as to remove the photoresist layer outside an area where the black matrix is formed, and the patterned photoresist layer is formed with a first thickness in a first area where the gate electrode of the TFT device is formed and a second thickness in a second area outside the first area, wherein the first thickness is less than the second thickness; etching off the stack layer outside the black matrix area using the patterned photoresist layer so as to pattern the stack layer; removing the patterned photoresist layer by the first thickness, and forming separate source electrode and drain electrode using remained photoresist layer; removing the remained photoresist layer by an ashing process, and depositing an insulating layer on resulting structure; and forming a gate electrode on the insulating layer between the source electrode and the drain electrode.

According to embodiments of the invention, the step of preparing the array substrate further comprises forming a pixel electrode which is formed on the insulating layer and connected with the source electrode through via holes in the insulating layer. The step of forming the black matrix and the TFT device on the first substrate further comprises forming an ohmic contact layer between the source electrode and the active layer and/or between the drain electrode and the active layer.

According to the embodiments of the invention, the black matrix is formed directly on the array substrate, therefore a top gate TFT device can be formed on the array substrate with the gate electrode on a side of the TFT device facing away the black matrix e. Such structure can further improve the aperture ratio of TFT-LCD, and simplify the manufacturing process and reduce production cost due to the use of top gate TFT device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention.

DETAILED DESCRIPTION

Figure 2:
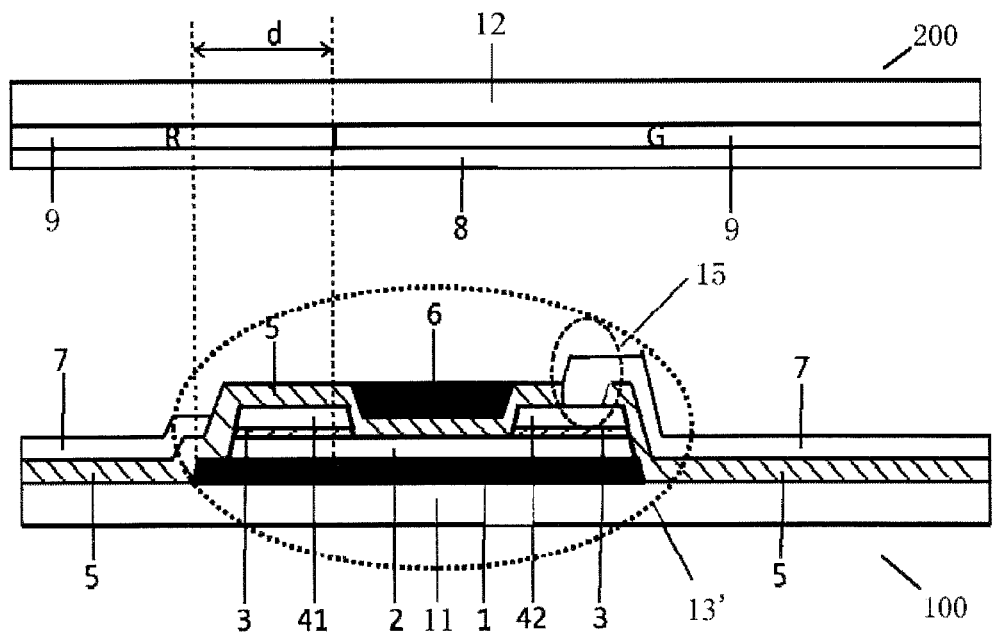
FIG. 2 is a schematic view of a TFT-LCD according to an embodiment of the invention.

FIG. 2 is a schematic view of a TFT-LCD according to an embodiment of the invention. As shown in FIG. 2, the TFT-LCD according to the embodiment of the invention comprises an array substrate 100, a color filter substrate 200 and a liquid crystal layer (not shown) formed between the array substrate 100 and the color filter substrate 200. The array substrate 100 comprises a first substrate 11, a black matrix 1 formed on the first substrate 11, and a thin film transistor (TFT) device 13' formed on the black matrix 1. The TFT device is a top gate TFT device which has a gate electrode 6 formed on a side facing away from the black matrix 1. The color filter substrate 200 comprises a second substrate 12 and a color filter layer 9 formed on the second substrate 12. The color filter layer 9 may include red, green and blue color filters. The color filter substrate 200 further comprises a counter electrode 8 formed on the color filter layer 9. The counter electrode 8 may be formed of transparent conductive materials such as indium tin oxide (ITO). The first substrate 11 and the second substrate 12 may be formed of glass, for example.

Figure 1:
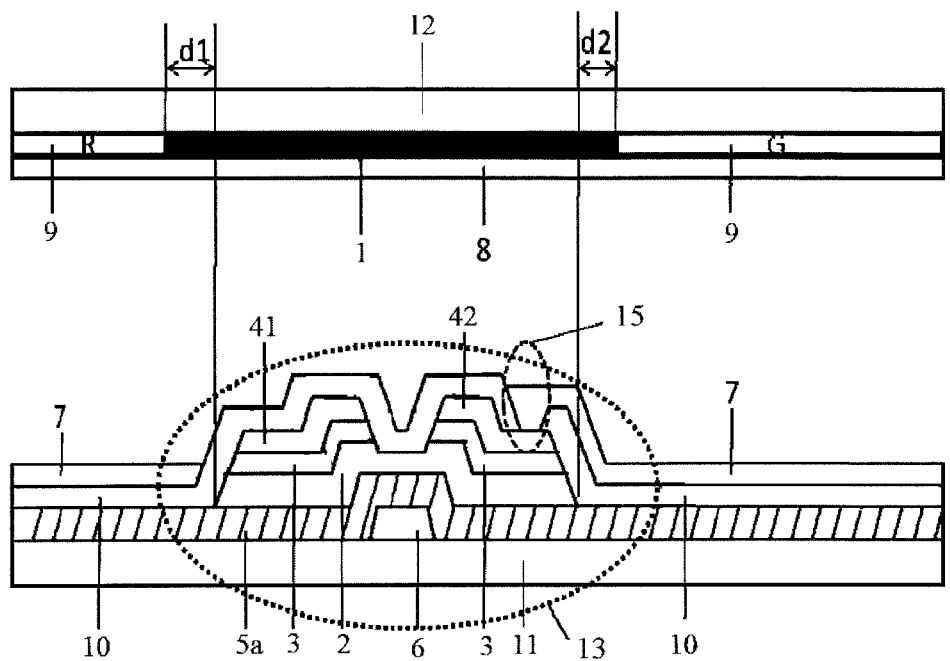
FIG. 1 is a schematic view of a conventional TFT-LCD.

The top gate TFT device 13' comprises: an active layer 2 formed on the black matrix 1; an ohmic contact layer 3 optionally formed on the active layer 2; a source electrode 41 and a drain electrode 42 formed on a part of the ohmic contact layer 3; an insulating layer 5 formed above the active layer 2 and covering the source electrode 41 and the drain electrode 42; and the gate electrode 6 formed on the insulating layer 5 between the source electrode 41 and the drain electrode 42. The array substrate 100 further comprises a pixel electrode 7 which is connected to the drain electrode 42 through a via hole 15 in the insulating layer 5. The pixel electrode 7 may be formed of indium tin oxide (ITO), for example. The area occupied by the top gate TFT device 13' on the first substrate 11 is contained within the area occupied by the black matrix 1 on the first substrate 11. Further, TFT device 13' and the black matrix 1 may occupy a same area on the first substrate 11. That is, in the embodiment of the invention, it is sufficient to make the black matrix 1 just cover the TFT device 13' in order to prevent light leakage, without any substantial overlaps (d1, d2 portion shown in FIG. 1) between the area occupied by the black matrix 1 and the area occupied by the pixel electrode 7 in the conventional liquid crystal display as shown in FIG. 1. Therefore, the aperture ratio is improved. Additionally, according to the embodiment of the invention, the overlap (d as shown in FIG. 2) between the color filter (R, G or B) in the color filter substrate 200 and the TFT device 13' in the array substrate 100 can be increased, thereby reducing manufacturing difficulty and lowering requirements for assembling accuracy. Moreover, according to the embodiment of the invention, the black matrix is not formed in the color filter substrate, therefore the requirement for process accuracy is less stringent and the process is simpler.

Figure 3:
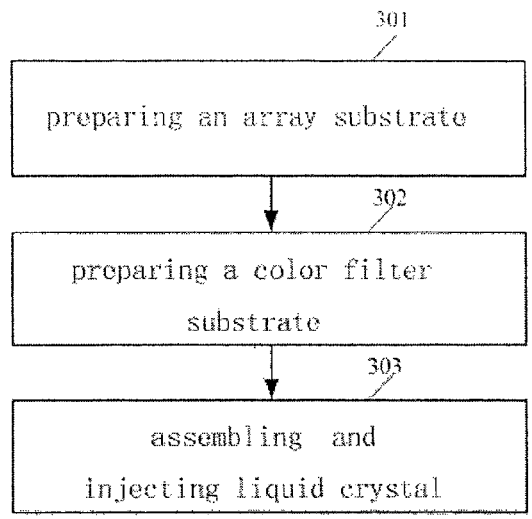
FIGS. 3-5 are flow charts showing a method of manufacturing TFT-LCD according to an embodiment of the invention.
Figure 4:
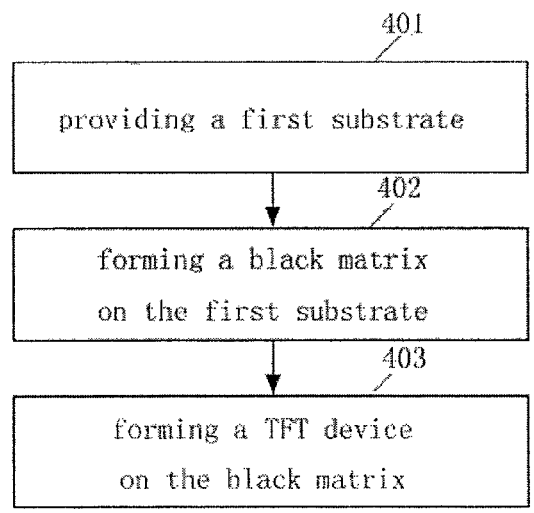
Figure 5:
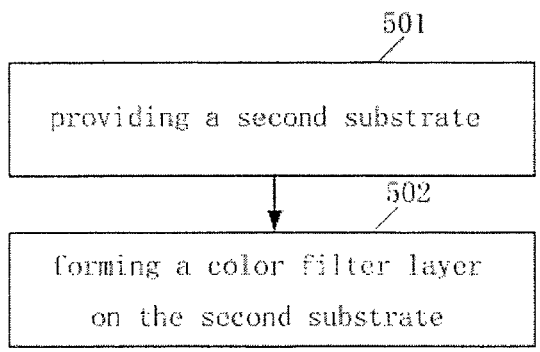

FIGS. 3-5 show flow charts of a method of manufacturing liquid crystal display according to an embodiment of the invention. As shown in FIG. 3, the method comprises steps of preparing an array substrate (301), preparing a color filter substrate (302) and assembling the array substrate and the color filter substrate and injecting liquid crystal material between the array substrate and the color filter substrate (303). As shown in FIG. 4, the step of preparing the array substrate comprises steps of providing a first substrate (401); forming a black matrix on the first substrate (402) and forming a thin film transistor (TFT) device on the black matrix (403). The TFT device is a top gate TFT device having a gate electrode formed on a side of the TFT device facing away the black matrix. As shown in FIG. 5, the step of preparing the color filter substrate comprises steps of providing a second substrate (501) and forming a color filter layer on the second substrate (502).

According to the embodiment of the invention, the steps of forming the black matrix and the TFT device on the first substrate comprises the following steps, as shown in FIGS. 6-9.

Figure 6:
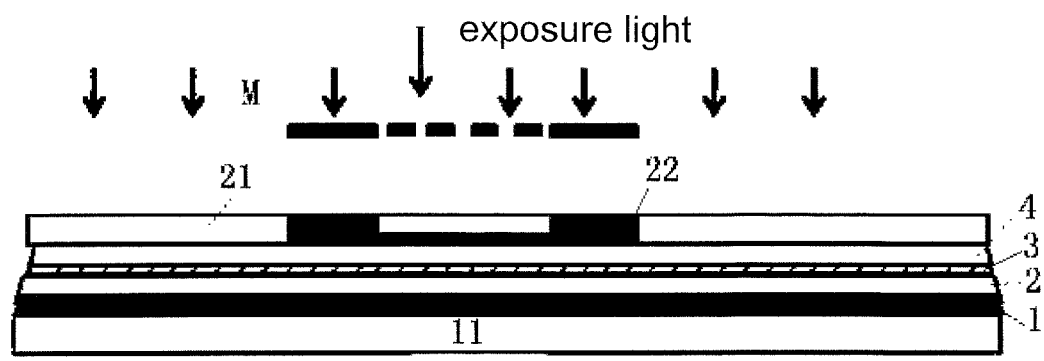
FIGS. 6-9 are schematic sectional views showing the step of forming a black matrix and a top gate TFT device on a first substrate according to an embodiment of the invention.
Figure 7:
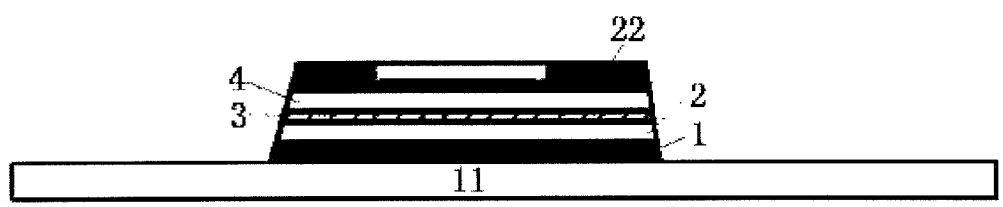

As shown in FIG. 6, a stack layer including a black matrix layer 1, an active layer 2, an optional ohmic contact layer 3 and an electrode layer 4 is formed successively in this order on the first substrate 11. As shown in FIG. 7, a photoresist layer 21 is formed on the stack layer; and the photoresist layer is patterned using a half tone mask M by photolithography and etching processes so as to remove the photoresist outside an area where the black matrix will be formed. The patterned photoresist layer 22 is formed with a first thickness in an area where the gate electrode 6 will be formed and a second thickness in the area of the black matrix area outside the gate electrode area. The first thickness is less than the second thickness.

Figure 8:
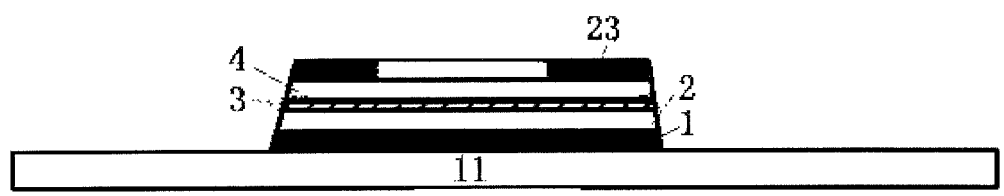
Figure 9:
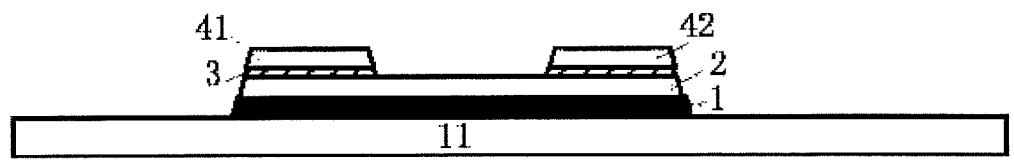

As shown in FIG. 8, the stack layer outside the black matrix area is etched off using the patterned photoresist layer 22 so as to pattern the stack layer. Then the photoresist layer 22 is thinned by the first thickness. Next, the electrode layer 4 is patterned using the remained photoresist layer 23 so as to form a source electrode 41 and a drain electrode 42 separated from each other and expose the channel area between the source electrode 41 and the drain electrode 42. Then as shown in FIG. 9, the remained photoresist layer 23 is removed by an ashing process. Next, an insulating layer 5 may be deposited on the resulting structure, and a gate electrode 6 may be formed on the insulating layer 5 between the source electrode 41 and the drain electrode 42. In addition, via holes may be formed in the insulating layer 5 above the source electrode 41 by a conventional mask process, so as to further form a pixel electrode 7 connected to the source electrode 41.

According to the embodiments of the invention, in the array substrate, the black matrix is formed under the top gate TFT device (BM Under TFT), which reduces the overlap area of the black matrix and the pixel electrode. With the BM Under TFT structure as described above, the black matrix formed at the bottom blocks lights from a back light source unit disposed below. The gate electrode located on the top of the top gate TFT may also prevent the reflected light from interfering with the active layer (a-Si). Due to these two aspects, the aperture ratio of TFT-LCD is increased. According to the embodiments of the invention, in the color filter substrate, the formation process of the black matrix may be omitted, instead the color filter layer of R, G, B pixels can be formed directly on the glass substrate. Without considerations for the black matrix, the area of the pixel region can be larger, and the requirement for accuracy is lowered, and the process is simpler.

In addition, according to the manufacturing method of the embodiment of the invention, the manufacturing process of TFT substrate is simplified to a 4Mask process. This will reduce exposure processes and save the cost.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A liquid crystal display comprising:
an array substrate comprising:
    a first substrate;
    a black matrix formed on the first substrate; and
    a thin film transistor (TFT) device formed on the black matrix, wherein the TFT device is a top gate TFT device having a gate electrode formed on a side of the TFT device facing away the black matrix and an active layer made of a-Si;
a color filter substrate comprising:
    a second substrate; and
    a color filter layer formed on the second substrate; and
    a liquid crystal layer formed between the array substrate and the color filter substrate,
wherein the color filter substrate does not include a black matrix,
the TFT device comprises:
an active layer formed on the black matrix;
a source electrode and a drain electrode formed on respective parts of the active layer;
an insulating layer formed above the active layer and covering the source electrode and the drain electrode;
    the gate electrode formed on the insulating layer between the source electrode and the drain electrode.

2. The liquid crystal display as set forth in claim 1, wherein the array substrate further comprises a pixel electrode formed on the insulating layer and connected with the source electrode through via holes in the insulating layer.

3. The liquid crystal display as set forth in claim 2, wherein the pixel electrode is formed of indium tin oxide (ITO).

4. The liquid crystal display as set forth in claim 1, wherein the TFT device further comprises an ohmic contact layer formed between the source electrode and the active layer and/or between the drain electrode and the active layer.

5. The liquid crystal display as set forth in claim 1, wherein an area occupied by the TFT device on the first substrate is contained within an area occupied by the black matrix on the first substrate.

6. The liquid crystal display as set forth in claim 5, wherein the TFT device and the black matrix occupy the same area on the first substrate.

7. The liquid crystal display as set forth in claim 1, wherein the color filter substrate further comprises a counter electrode formed on the color filter layer.

8. The liquid crystal display as set forth in claim 7, wherein the counter electrode is formed from indium tin oxide (ITO).

9. The liquid crystal display as set forth in claim 1, wherein the first substrate and the second substrate are formed of glass.

10. A method of manufacturing liquid crystal display comprising steps of:
preparing an array substrate comprising steps of:
    providing a first substrate;
    forming a black matrix on the first substrate and forming a thin film transistor(TFT) device on the black matrix, wherein the TFT device is a top gate TFT device having a gate electrode formed on a side of the TFT device facing away the black matrix and an active layer made of a-Si;
preparing a color filter substrate comprising steps of:
    providing a second substrate; and
    forming a color filter layer on the second substrate; and
    assembling the array substrate and the color filter substrate and injecting liquid crystal between the array substrate and the color filter substrate,
wherein the color filter substrate does not include a black matrix,
the step of forming the black matrix and the TFT device on the first substrate comprises:
forming a stack layer including a black matrix layer, an active layer and an electrode layer in this order on the first substrate;
forming a photoresist layer on the stack layer;
patterning the photoresist layer using a half tone mask by a lithography and etching, so as to remove the photoresist layer outside an area where the black matrix is formed, and the patterned photoresist layer is formed with a first thickness in a first area where the gate electrode of the TFT device is formed and a second thickness in a second area outside the first area, wherein the first thickness is less than the second thickness;

etching off the stack layer outside the black matrix area using the patterned photoresist layer so as to pattern the stack layer;

removing the patterned photoresist layer by the first thickness, and forming separate source electrode and drain electrode using remained photoresist layer;

removing the remained photoresist layer by ashing, and depositing an insulating layer on resulting structure; and forming a gate electrode on the insulating layer between the source electrode and the drain electrode.

11. The method as set forth in claim 10, wherein said step of preparing array substrate further comprises forming a pixel electrode which is formed on the insulating layer and connected with the source electrode through via holes in the insulating layer.

12. The method as set forth in claim 10, wherein the step of forming the black matrix and the TFT device on the first substrate further comprises forming an ohmic contact layer between the source electrode and the active layer and/or between the drain electrode and the active layer.

13. The method as set forth in claim 10, wherein an area occupied by the TFT device on the first substrate is contained within an area occupied by the black matrix on the first substrate.

14. The method as set forth in claim 13, wherein the TFT device and the black matrix occupy a same area on the first substrate.

\* \* \* \* \*